United States Patent
Nishii et al.

(10) Patent No.: US 8,069,557 B2
(45) Date of Patent: Dec. 6, 2011

(54) METHOD OF MANUFACTURING CIRCUIT FORMING BOARD

(75) Inventors: Toshihiro Nishii, Osaka (JP); Yoshihiro Kawakita, Osaka (JP); Kunio Kishimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 1155 days.

(21) Appl. No.: 10/517,445

(22) PCT Filed: May 14, 2004

(86) PCT No.: PCT/JP2004/006868
§ 371 (c)(1),
(2), (4) Date: Dec. 9, 2004

(87) PCT Pub. No.: WO2004/103041
PCT Pub. Date: Nov. 25, 2004

(65) Prior Publication Data
US 2005/0198818 A1      Sep. 15, 2005

(30) Foreign Application Priority Data

May 19, 2003    (JP) .................................. 2003-140137

(51) Int. Cl.
*H05K 3/36* (2006.01)
(52) U.S. Cl. ............... 29/830; 29/831; 29/846; 156/230
(58) Field of Classification Search ................ 29/825, 29/829–831, 846, 848, 851; 156/102, 228, 156/230, 233, 582, 583.1; 174/262; 216/20; 428/96
See application file for complete search history.

(56) References Cited

U.S. PATENT DOCUMENTS

| | | | | |
|---|---|---|---|---|
| 3,810,816 | A | * | 5/1974 | Zachariades .................. 428/428 |
| 4,470,858 | A | * | 9/1984 | McMaster ...................... 156/103 |
| 5,387,301 | A | * | 2/1995 | Miyao et al. .................. 156/237 |
| 5,481,795 | A | * | 1/1996 | Hatakeyama et al. .......... 29/852 |
| 6,425,969 | B1 | * | 7/2002 | van den Akker .............. 156/177 |
| 7,063,768 | B2 | * | 6/2006 | Tsujimoto et al. ............ 156/229 |

FOREIGN PATENT DOCUMENTS

| | | |
|---|---|---|
| JP | 4-323034 | 11/1992 |
| JP | 6-39958 | 2/1994 |
| JP | 6-268345 | 9/1994 |
| JP | 11-77589 | 3/1999 |
| JP | 11-277676 | 10/1999 |
| JP | 2000-174438 | 6/2000 |

OTHER PUBLICATIONS

European Search Report issued Oct. 12, 2009 in European Patent Application No. 04 73 3120, which is a foreign counterpart of the present application.

* cited by examiner

*Primary Examiner* — Donghai D. Nguyen
(74) *Attorney, Agent, or Firm* — Wenderoth, Lind & Ponack, L.L.P.

(57) ABSTRACT

In a method of manufacturing a circuit forming board, a first sheet having a first direction is transferred in a second direction, so that the first direction of the first sheet is parallel to the second direction. Films are stuck onto both surfaces of the first sheet while transferring the first sheet in a third direction orthogonal to the first direction of the first sheet. This method allows a connecting member, such as conductive paste, to electrically couple between layers of the circuit forming board.

12 Claims, 8 Drawing Sheets

US 8,069,557 B2

METHOD OF MANUFACTURING CIRCUIT FORMING BOARD

TECHNICAL FIELD

The present invention relates to a method of manufacturing a circuit forming board used in electronic apparatuses.

BACKGROUND OF THE INVENTION

As electronic apparatuses have had a reduced size and included dense arrangement in their packages, circuit-forming boards having electronic components mounted thereon employ double-sided and multi-layer boards which can have more circuits and more components mounted thereon.

A conventional circuit forming board disclosed in Japanese Patent Laid-Open Publication No. 6-268345 will be explained. FIG. 6 illustrates a method of manufacturing prepreg sheet 13, a material of the board. A fiber sheet, such as glass cloth 11, used as a reinforcing member is dipped into varnish 12, impregnating impregnation material containing solvent having thermosetting resin diluted therein, thus impregnating glass cloth 11 with a predetermined amount of varnish 12. In order to adjust the amount of varnish 12, varnish 12 is squeezed by rollers, and then, is heated to change into a semi-cured state (stage B). The glass cloth in the stage B containing varnish is cut into pieces having a predetermined size, thus providing prepreg sheets 13 as material of circuit forming boards.

As shown in FIG. 6, prepreg sheet 13 is cut into a rectangle having longitudinal direction 202. The longitudinal direction 202 is oriented along a machine direction (MD), a direction in which glass cloth 11 is transferred. Film is stuck onto each surface of prepreg sheet 13 by a method shown in FIGS. 7 and 8.

FIG. 7 is a perspective view illustrating a process of sticking the film on prepreg sheet 13. FIG. 8 illustrates prepreg sheet 13 and film 14 seen along direction 204 in the process. Prepreg sheet 13 is introduced between films 14 along direction 201 (MD), i.e. the longitudinal direction 202, and then, films 14 are pressed onto prepreg sheet 13 by heated rollers 15, thereby heating and pressing prepreg sheet 13. Since the resin impregnated in prepreg sheet 13 is in the semi-cured state, the resin melts due to the heating, hence allowing films 14 to adhere temporarily onto prepreg sheet 13. Then, films 14 are cut into pieces having predetermined sizes along line 203, hence providing laminated prepreg sheet 16.

A method of manufacturing the circuit forming board will be described hereinafter. FIGS. 9A-9G show sectional views of the circuit forming board for illustrating the method of manufacturing the board. FIG. 9A shows laminated prepreg sheet 16 including prepreg sheet 13 and films 14 adhering onto both surfaces of sheet 13. As shown in FIG. 9B, prepreg sheet 16 is pierced by a laser beam, thereby forming a via-hole 17. The hole 17 is then filled with conductive paste 18 by printing, as shown in FIG. 9C. Conductive paste 18 is formed by mixing metallic particles, such as copper, with thermosetting resin, such as epoxy resin. Then, as shown in FIG. 9D, films 14 are peeled off. Since a small amount of resin component of films 14 melting on the surfaces of prepreg sheet 13 to allow films 14 to be temporarily stuck onto prepreg sheet 13, films 14 can be peeled off easily. As shown in FIG. 9D, paste 18 projects from sheet 13 by the thicknesses of films 14 after the peeling of the films. Then, as shown in FIG. 9E, copper foils 19 are placed on upper and lower surfaces of sheet 13, and then is hot-pressed by a hot presser, such as a vacuum hot presser. The resin component of sheet 13 melts and undergoes molding and curing steps, and then conductive paste 18 is compressed. As a result, copper foils 19 on both surfaces of sheet 13 are electrically connected to paste 18, as shown in FIG. 9F. Then, copper foils 19 are etched to have a predetermined pattern for forming circuit 20, as shown in FIG. 9G, thus providing a double-sided circuit forming board.

In the foregoing method, sheet 13 shown in FIG. 9D, upon having an uneven thickness, causes variation of a compressing rate of paste 18 at the hot-pressing, as shown in FIGS. 9E and 9F. The variation causes variation of a resistance of paste 18 which connects circuits 20 on both surfaces of the circuit forming board, thereby adversely affecting quality and reliability of the board.

That is, via-hole 17 formed in a thick portion of prepreg sheet 13, as shown in FIG. 9D, reduces a compression rate of paste 18, hence increasing a resistance of paste 18.

On the contrary, via-hole 17 formed in a thin portion of sheet 13 increases the compression rate of paste 18, hence reducing a resistance of paste 18. As such, the compression rate actually varies from a standard rate estimated based on an amount of the metallic particles mixed with the thermosetting resin, hence reducing the reliability of the coupling.

If the circuit forming board is required to have equal resistances, for instance, for handling high frequency signals, it is undesirable to allow electric resistance of paste 18 to vary according to a position of the board.

Even after films 14 are stuck onto prepreg sheet 13 having a large variation of the thickness, the variation of the thickness of sheet 13 still remains, hence allowing the variation of the thickness of the sheet 13 to remain even in laminated prepreg sheet 16. This problem also occurs in cases other than the case that glass cloth 11, a woven fabric, is employed as the material of prepreg sheet 13, i.e., the fiber sheet as the reinforcing member. This problem may occur in the case that unwoven fabric is employed. Woven fabric is impregnated with an amount of varnish 12 less than unwoven fabric. A larger amount of varnish 12 is accordingly attached at the surfaces of prepreg sheet 13, hence allowing the variation of the thickness of the woven fabric to affect electrical properties of conductive paste 18.

As thinner circuit forming boards have been recently demanded, glass cloth 11 becomes thin. This increases the amount of varnish 12 attached at the surface of prepreg sheet 13, hence making the above problem more serious.

In order to prevent the problem, it is essential that prepreg sheet 13 shown in FIG. 9A has an even thickness.

However, an accuracy limitation of manufacturing apparatuses limits flatness of the thickness of prepreg sheet 13 to a certain level when varnish 12 is squeezed with rollers, as shown in FIG. 6, and when films 14 are stuck onto both surfaces of sheet 13.

SUMMARY OF THE INVENTION

In a method of manufacturing a circuit forming board, a first sheet having a first direction is transferred in a second direction, so that the first direction of the first sheet is parallel to the second direction. Films are stuck onto both surfaces of the first sheet while transferring the first sheet in a third direction orthogonal to the first direction of the first sheet.

This method allows a connecting member, such as conductive paste, to electrically couple between layers of the circuit forming board.

BRIEF DESCRIPTIONS OF THE DRAWINGS

DETAILED DESCRIPTION OF PREFERRED EMBODIMENT

Figure 6:
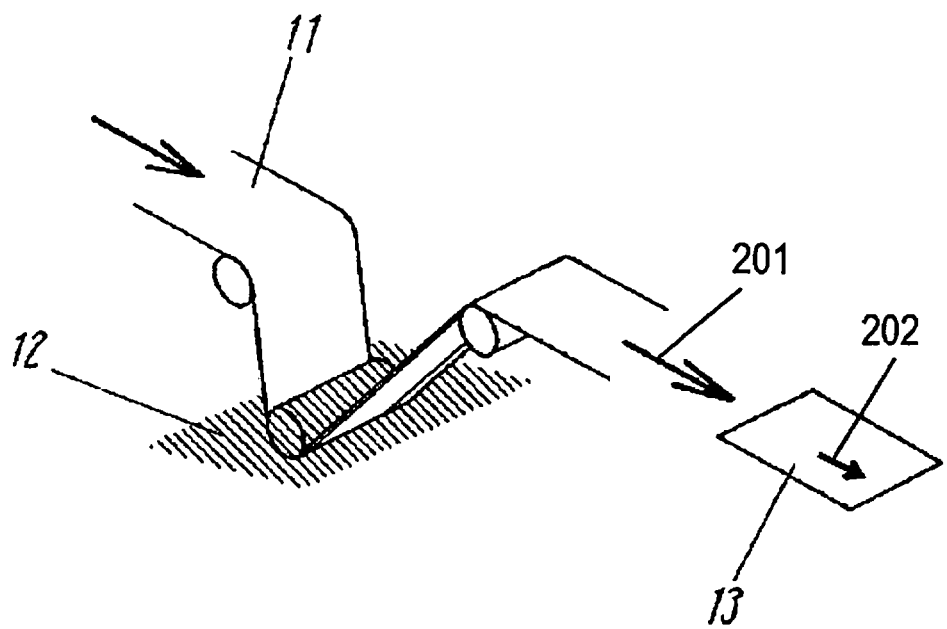
FIG. 6 is a perspective view illustrating a conventional method of manufacturing a prepreg sheet.
Figure 7:
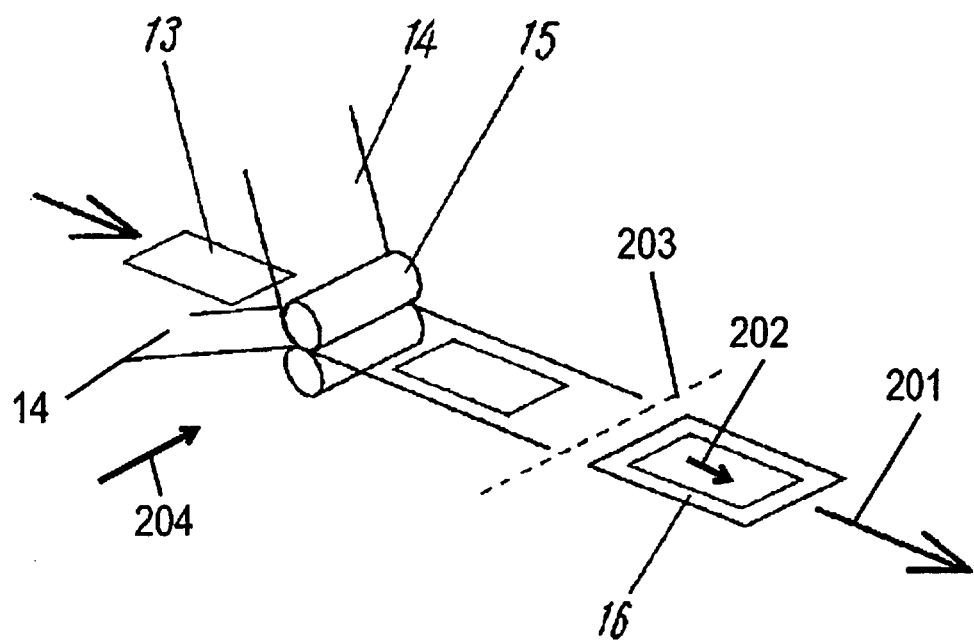
FIG. 7 is a perspective view illustrating the conventional method.
Figure 8:
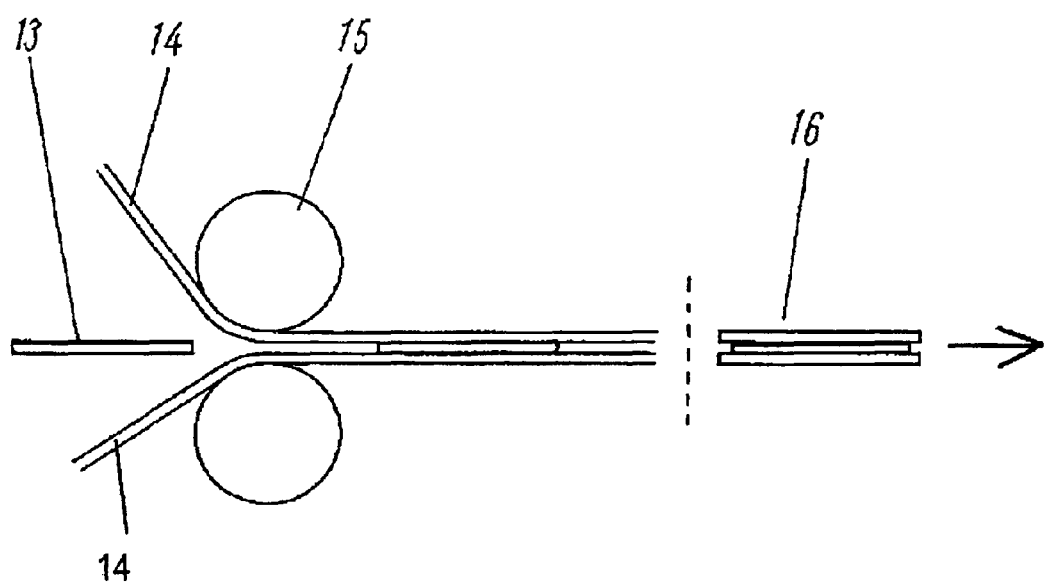
FIG. 8 is a side sectional view illustrating the conventional method.

According to experiments, causes of a variation of a thickness of conventional prepreg sheet 13 manufactured by a method shown in FIGS. 6-8 were confirmed.

Figures 9A, 9B, 9C, 9D, 9E, 9F, 9G:
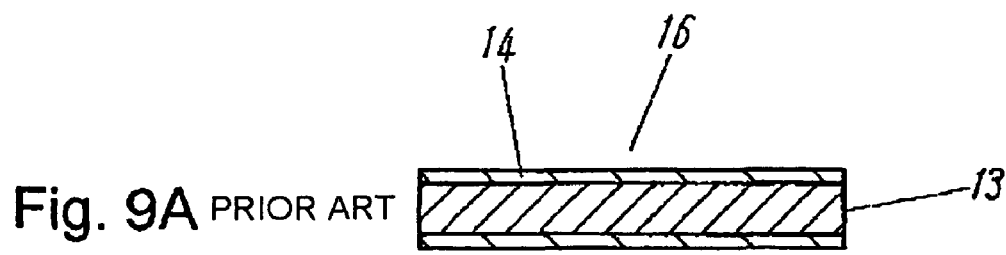
FIGS. 9A-9G are sectional views of the circuit forming board for illustrating the conventional method of manufacturing the board.
Figure 10A:
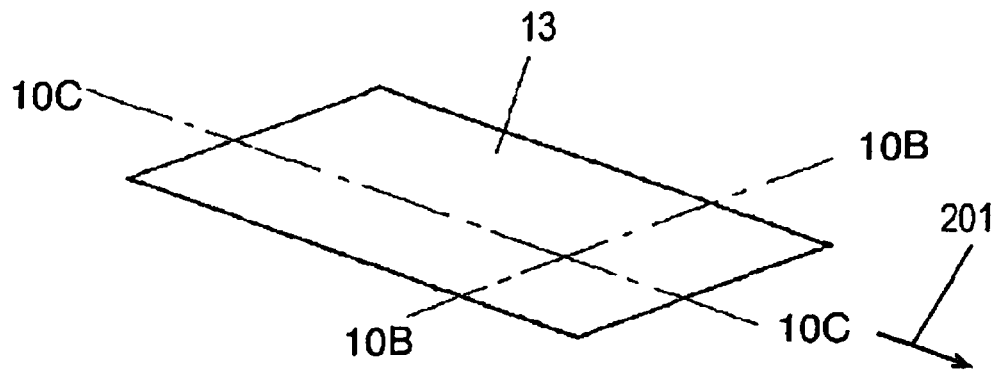
FIGS. 10A-10C are perspective and sectional views of the conventional prepreg sheet.
Figure 10B:
Figure 10C:

Conventional prepreg sheet 13 having an uneven thickness shown in FIG. 9A will be described. FIG. 10A is a perspective view of prepreg sheet 13. FIG. 10B is a sectional view of prepreg sheet 13 taken along line 10B-10B shown in FIG. 10A. FIG. 10C is a sectional view of prepreg sheet 13 taken along line 10C-10C shown in FIG. 10A.

Films 14 were peeled off from both surfaces of sheet 13 to observe the cross section of sheet 13. A larger variation of the thickness was found in the section shown in FIG. 10B taken along line 10B-10B shown in FIG. 10A. A smaller variation of the thickness was found in the cross section shown in FIG. 10C taken along line 10C-10C shown in FIG. 10A.

As shown in FIG. 6, glass cloth 11 impregnated with liquid varnish 12 is transferred in a machine direction (MD) 201 while varnish 12 is squeezed with rollers in order to adjust an amount of varnish 12 impregnated in the glass cloth. Along MD 201, a small variation of the amount of varnish 12 was found, namely, a variation of the thickness of sheet 13 was small. However, a large variation of the thickness of sheet 13 was found along a direction orthogonal to MD 201.

Figure 1:
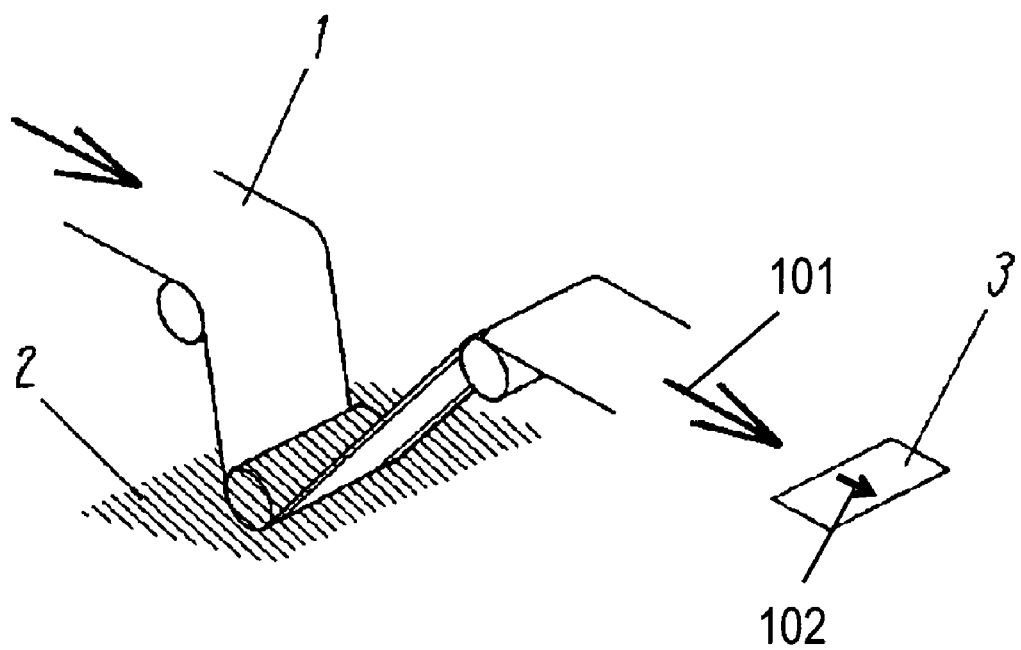
FIG. 1 is a perspective view illustrating a method of manufacturing a prepreg sheet in accordance with an exemplary embodiment of the present invention.

FIG. 1 shows a perspective view illustrating a method of manufacturing prepreg sheet 3 in accordance with an exemplary embodiment of the present invention. A fiber sheet used as a reinforcing member, such as glass cloth 1, is dipped into varnish 2, i.e. impregnating impregnation material formed by diluting thermosetting resin with solvent, and glass cloth 1 is impregnated with a predetermined amount of varnish 2. In order to adjust the amount of varnish 2 impregnated, varnish 2 is squeezed with rollers, and is then heated to be in a semi-cured state (stage B). The glass cloth in stage B containing varnish is cut into pieces having predetermined sizes, thus providing prepreg sheet 3, a material of a circuit forming board.

As shown in FIG. 1, prepreg sheet 3 is cut into a rectangular shape having a short-side direction 102 oriented along the direction 101 in which glass cloth 1 is transferred, namely, a machine direction (MD).

FIG. 1 shows a single prepreg sheet 3; however, plural prepreg sheets 3 may be actually arranged in a row with taking into consideration about a width of glass cloth 1 and intervals of cutting. For example, glass cloth 1 having a width of about 1 m provides two prepreg sheets 3 each having a long-side of 400 mm and a short-side of 300 mm wide arranged in a row by cutting glass cloth 1.

Figure 2A:
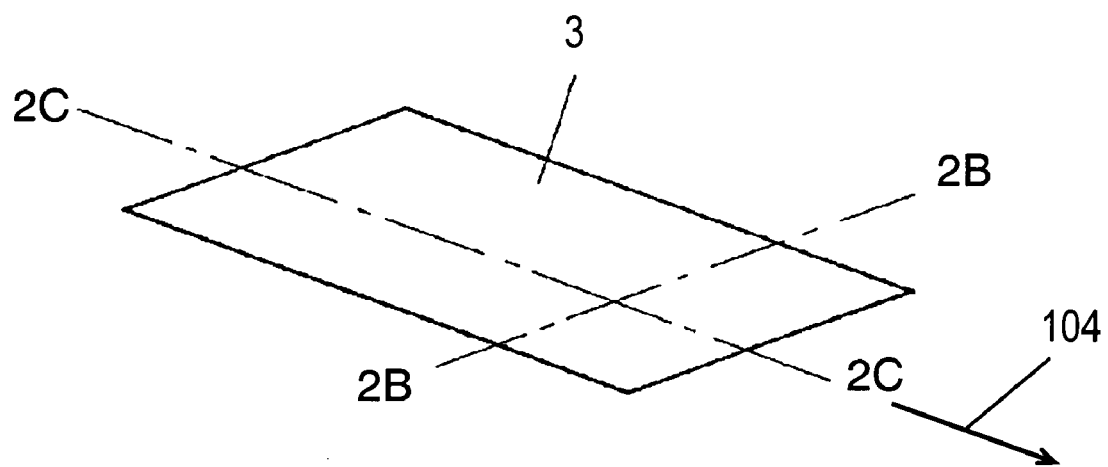
FIGS. 2A-2C are perspective and sectional views of the prepreg sheet in accordance with the embodiment.
Figure 2B:
Figure 2C:

FIG. 2A is a perspective view illustrating prepreg sheet 3 thus manufactured. FIG. 2B is a sectional view of prepreg sheet 3 taken along line 2B-2B shown in FIG. 2A. FIG. 2C is a sectional view of prepreg sheet 3 taken along line 2C-2C shown in FIG. 2A. A variation of the thickness along a short-side direction shown in FIG. 2B is smaller than a variation of the thickness along the long-side direction shown in FIG. 2C.

Figure 3:
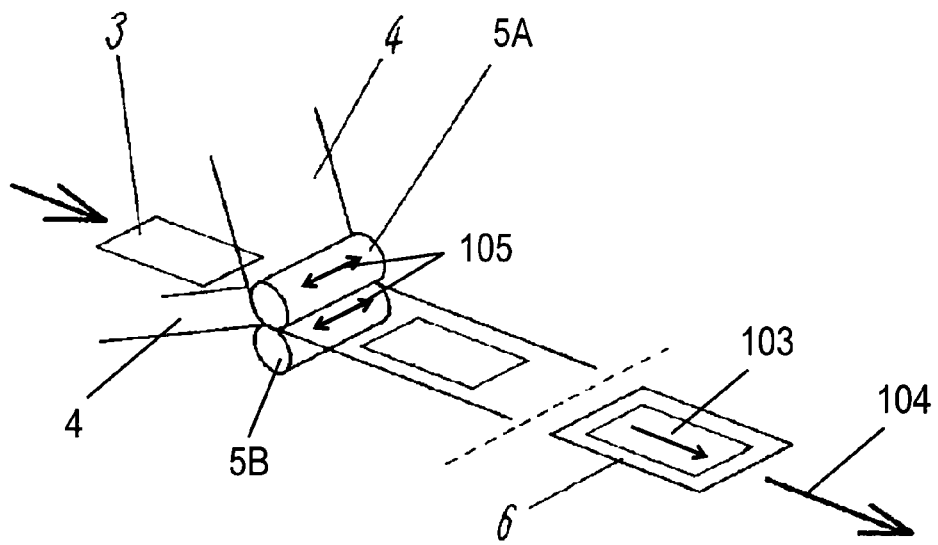
FIG. 3 is a perspective view illustrating the method of manufacturing the prepreg sheet in accordance with the embodiment.
Figure 4:
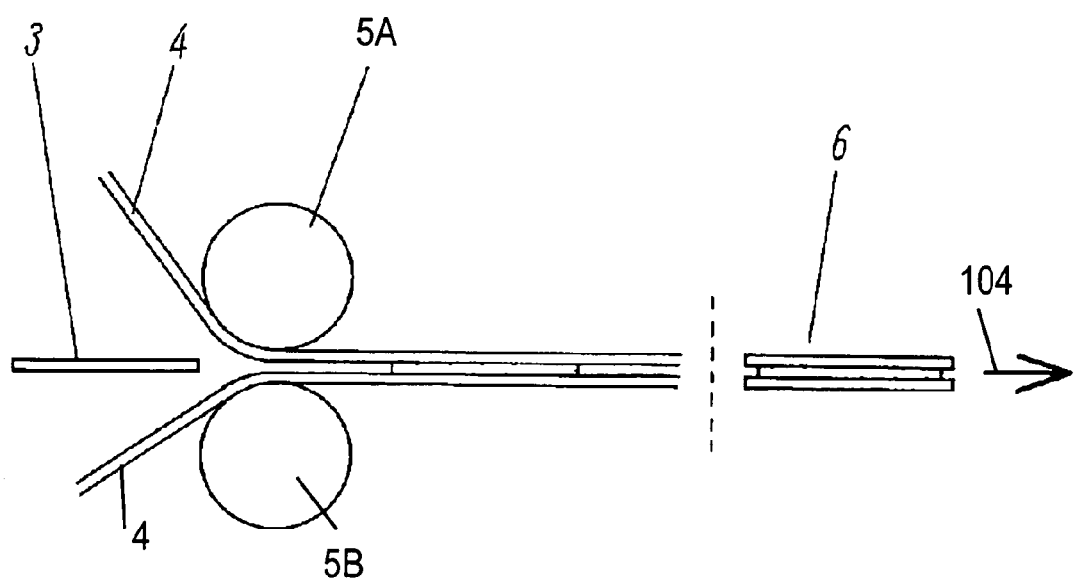
FIG. 4 is a sectional view illustrating the method of manufacturing the prepreg sheet in accordance with the embodiment.

Next, films 4 are pressed onto prepreg sheet 3 with heated rollers 5A and 5B, and are stuck onto sheet 3, as shown in FIGS. 3 and 4. While films 4 are adhered, the long-side direction 103 of sheet 3 matches MD 104, namely, the direction in which sheet 3 is transferred.

Factors, such as variations of diameters of heated rollers 5A and 5B, a pressure applied to them, a heating temperature, and parallelism between rollers 5A and 5B tend to disperse along an axial direction 105 of the heated rollers. As shown in FIG. 3, axial direction 105 of rollers 5A and 5B matches short-side direction 102 of prepreg sheet 3, thereby reducing the width of sheet 3 with respect to MD 104 while films 4 are stuck onto sheet 3. This arrangement reduces adverse effects due to the variations of rollers 5A and 5B, hence increasing adhesion quality of films 4 onto sheet 3.

According to the embodiment, MD 101 for manufacturing prepreg sheet 3 is orthogonal to MD 104 for sticking film 4 with respect to prepreg sheet 3.

This arrangement reduces the variation of the thickness of sheet 3.

Variations of the thickness, the heating temperature, and a pressure along MD 101 and MD 103 are small during the manufacturing of prepreg sheet 3 and the sticking of films 4. However, the variations are large along a direction orthogonal to MD 101 and MD 103. Therefore, if MD 101 matches MD 103 with respect to prepreg sheet 3 during the manufacturing of the prepreg sheet and the sticking of films 4, the variation of the thickness of sheet 3 remains until the circuit forming board is manufactured.

However, if MD 101 for manufacturing prepreg sheet 3 is orthogonal to MD 103 for sticking films 4 with respect to prepreg sheet 3, the variations occurring in the both processes are cancelled, hence providing sheet 3 in laminated prepreg sheet 6 with a uniform thickness.

In other words, the variation of the thickness due to the variation of the amount of varnish 12 attached to fiber sheet 3 during the manufacturing of sheet 3 is reduced by heating and pressing prepreg sheet 6 during the sticking of films 4.

Next, a method of manufacturing the circuit forming board in accordance with the embodiment will be described with reference to FIGS. 5A-5G. Laminated prepreg sheet 6, a material of the board, shown in FIG. 5A includes prepreg sheet 3 and films on both surfaces of sheet 3. As shown in FIG. 5B, sheet 3 is pierced by a laser beam, thereby forming via-holes 7, and then, via-holes 7 are filled with conductive paste 8 by printing. Conductive paste 8 is formed by mixing metallic particles, such as copper, with thermosetting resin, such as epoxy resin.

Figure 5A:
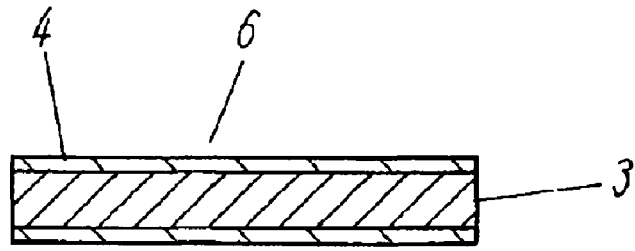
FIGS. 5A-5G are sectional views of the circuit forming board for illustrating the method of manufacturing the board in accordance with the embodiment.
Figure 5B:
Figure 5C:
Figure 5D:
Figure 5E:
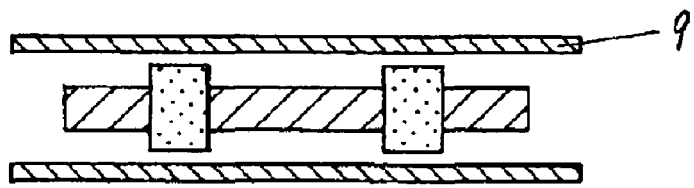
Figure 5F:
Figure 5G:

Then, as shown in FIG. 5D, films 4 are peeled off from sheet 6. Since just a small amount of resin component of films 4 melting on the surfaces of sheet 3 to allow films 4 to be temporarily stuck onto sheet 3, films 4 can be peeled off easily. As shown in FIG. 5D, paste 8 projects from sheet 3 by thicknesses of films 4 after the peeling. Next, as shown in FIG. 5E, copper foils 9 are placed on upper and lower surfaces of sheet 3, and are then hot-pressed by a hot presser, such as a vacuum hot presser. The resin component of sheet 3 melts and undergoes molding and curing steps, and then, conductive paste 8 is compressed. As a result, copper foils 9 on both surfaces of sheet 3 are electrically connected to paste 8, as shown in FIG. 5F. Then, copper foils 9 are etched to have predetermined pattern for forming circuit 10, as shown in FIG. 5G, thus providing a double-sided circuit forming board.

Films 4 were peeled off from laminated prepreg sheet 6 shown in FIG. 5A, and then, the thickness of prepreg sheet 3 was measured. It was observed that the sheet has a uniform thickness also from the appearance of films 4 of laminated sheet 6. Since having uniform surfaces, the sheet 3 stabilizes an electric resistance of conductive paste 8 becomes stable, and can be handled easily during the forming of the via-holes, thus having stable dimensions in each process.

According to the embodiment, prepreg sheet 3, a board material is made of woven fabric, i.e. a fiber sheet, such as regular glass cloth 1, or non-woven fabric, impregnated with thermosetting resin in stage B. The fiber sheet can employ organic fabric, such as aramid, instead of the glass cloth.

Varnish 2 can be replaced with inorganic material which is cured to provide a rigid board, other than the thermosetting resin. A film base or a film in stage B that does not include fiber sheet, the reinforcing member, may be used as prepreg sheet 3.

Fiber sheet 1, the reinforcing member, may employ material containing woven fabric and unwoven fabric mixed with the woven fabric, for example, may employ material including two glass fiber sheets and non-woven glass fiber sheet between the two sheets.

The thermosetting resin according to this embodiment may be one of epoxy resin, epoxy-melamine resin, unsaturated polyester resin, phenol resin, polyimide resin, cyanate-based resin, ester cyanate resin, naphtalene resin, urea resin, amino resin, alkyd resin, silicon resin, furan-based resin, polyurethane resin, aminoalkyd resin, acrylic resin, fluoro resin, polyphenylene ether resin, ester cyanate resin. The thermosetting resin may be thermosetting resin composition formed by mixing plural resins selected from the foregoing resins, or thermosetting resin composition modified by thermoplastic resin. Fire-retardant or inorganic filler may be added to the thermosetting resin if necessary.

According to this embodiment, the method of manufacturing a double-sided circuit forming board is described. Processes of this method may be repeated for manufacturing a multi-layer circuit forming board, that is, circuit boards including prepreg sheets filled with conductive paste may be attached to each other, thereby providing a multi-layer circuit board.

Conductive paste 8 for coupling copper foils 9 is formed by mixing conductive particles, such as copper powder, with thermosetting resin containing curing agent. Paste 8 may be formed by mixing the conductive particles with polymer material having an appropriate viscosity which is discharged into the board material at the heat-pressing. The paste may be formed by mixing the conductive particles with solvent.

Instead of the conductive paste, post-shaped conductive projections formed by plating may be used. Conductive particles having large diameters and not formed into paste may be placed between copper foils 9 for coupling.

Boards are pierced for plating after the heat-pressing similarly to an ordinary multi-layer printed circuit board, so that layers of the boards can be coupled. Such boards may be manufactured by the method according to the embodiment.

INDUSTRIAL APPLICABILITY

The circuit forming board according to the present invention employs coupling member, such as conductive paste, between respective layers, hence providing stable and quality electrical connection between copper foils on both surfaces of the board.

REFERENCE NUMERALS

1 Glass Cloth
2 Varnish
3 Prepreg Sheet
4 Film
5A Heated Roller
5B Heated Roller
6 Multi-Layer Prepreg Sheet
7 Via-Hole
8 Conductive Paste
9 Copper Foil
10 Circuit

The invention claimed is:

1. A method of manufacturing a circuit forming board, comprising:
impregnating an elongated reinforcing member with impregnation material, the reinforcing member extending in a first direction;
transferring the reinforcing member in a second direction such that the first direction of the reinforcing member is parallel to the second direction,
wherein said impregnating of the elongated reinforcing member with impregnation material occurs simultaneously with said transferring of the reinforcing member in the second direction;
adhering films directly onto an upper surface and a lower surface, respectively, of the reinforcing member so as to be entirely peelable off of the upper and lower surfaces of the reinforcing member; and
transferring the reinforcing member in a third direction orthogonal to the first direction of the reinforcing member,
wherein said adhering of the films directly onto the upper surface and the lower surface, respectively, of the reinforcing member occurs simultaneously with said transferring of the reinforcing member in the third direction orthogonal to the first direction of the reinforcing member.

2. The method as defined in claim 1, wherein said adhering of the films comprises pressing the films onto the upper surface and the lower surface, respectively, of the reinforcing member with a heated roller.

3. The method as defined in claim 1, wherein the reinforcing member comprises woven fabric.

4. The method as defined in claim 1, further comprising:
forming a via-hole in the reinforcing member and the films adhered on the upper surface and the lower surface of the reinforcing member;
filling the via-hole with conductive paste;
peeling off the films from the reinforcing member; and
heating and pressing metallic foils onto the upper surface and the lower surface, respectively, of the reinforcing member after said peeling off of the films.

5. The method as defined in claim 1, wherein the reinforcing member has a rectangular shape having a long-side direction and a short-side direction, and the long-side direction is orthogonal to the first direction of the reinforcing member.

6. The method as defined in claim 1, wherein the reinforcing member has a side which extends in the first direction.

7. The method as defined in claim 1, wherein said transferring of the reinforcing member in the second direction includes transferring each of a plurality of separate reinforcing member segments in the second direction, each of the plurality of reinforcing member segments extending in the first direction,
- wherein said adhering of the films directly onto the upper surface and the lower surface, respectively, of the reinforcing member comprises adhering films onto an upper surface and a lower surface, respectively, of each of the plurality of separate reinforcing member segments, and
- wherein said transferring of the reinforcing member in the third direction comprises transferring each of the plurality of separate reinforcing member segments in the third direction.

8. The method as defined in claim 7, wherein said adhering of the films comprises adhering continuous films onto the upper surface and the lower surface, respectively, of each of the plurality of separate reinforcing member segments.

9. The method as defined in claim 7, wherein said impregnating of the elongated reinforcing member with impregnation material comprises impregnating a fiber sheet with a resin, the method further comprising:
- squeezing a part of the impregnated resin such that the impregnated resin is in a semi-cured state after said squeezing of the part of the impregnated resin,
- wherein said squeezing of the part of the impregnated resin occurs simultaneously with said transferring of the reinforcing member in the second direction; and
- cutting the fiber sheet into the plurality of separate reinforcing member segments after the impregnated resin is in the semi-cured state.

10. The method as defined in claim 1, wherein the reinforcing member is a prepreg sheet.

11. The method as defined in claim 1, wherein the reinforcing member comprises a fiber sheet, and wherein said impregnating of the elongated reinforcing member with impregnation material comprises impregnating the fiber sheet with a resin, the method further comprising:
- squeezing a part of the impregnated resin,
- wherein said squeezing of the part of the impregnated resin occurs simultaneously with said transferring of the reinforcing member in the second direction, and
- wherein the impregnated resin is in a semi-cured state after said squeezing of the part of the impregnated resin.

12. The method as defined in claim 1, wherein the reinforcing member comprises a fiber sheet, and wherein said impregnating of the elongated reinforcing member with impregnation material comprises impregnating the fiber sheet with a resin, the method further comprising:
- squeezing a part of the impregnated resin, wherein the impregnated resin is in a semi-cured state after said squeezing of the part of the impregnated resin, and wherein said squeezing of the part of the impregnated resin occurs simultaneously with said transferring of the reinforcing member in the second direction; and
- cutting the fiber sheet into a plurality of separate reinforcing members after the impregnated resin is in the semi-cured state.

* * * * *